(12) United States Patent
Joo

(10) Patent No.: US 7,482,691 B2
(45) Date of Patent: Jan. 27, 2009

(54) SEMICONDUCTOR DEVICE AND METHOD FOR FABRICATING THE SAME

(75) Inventor: Sung Joong Joo, Seo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/782,698

(22) Filed: Jul. 25, 2007

(65) Prior Publication Data
US 2008/0029891 A1 Feb. 7, 2008

(30) Foreign Application Priority Data
Aug. 3, 2006 (KR) .................. 10-2006-0073474

(51) Int. Cl.
H01L 23/48 (2006.01)
H01L 23/52 (2006.01)
H01L 29/40 (2006.01)

(52) U.S. Cl. ............... 257/751; 257/E21.174; 257/E21.495; 438/686

(58) Field of Classification Search .......... 257/751, 257/E21.495; 438/686
See application file for complete search history.

(56) References Cited

U.S. PATENT DOCUMENTS

| 7,008,871 B2 | 3/2006 | Andricacos et al. | |
| 2002/0160698 A1* | 10/2002 | Sato et al. | 451/67 |
| 2003/0164302 A1* | 9/2003 | Uzoh et al. | 205/125 |
| 2005/0045486 A1* | 3/2005 | Sahoda et al. | 205/123 |
| 2005/0126919 A1* | 6/2005 | Kubota et al. | 205/125 |
| 2006/0170068 A1* | 8/2006 | Ren et al. | 257/421 |

FOREIGN PATENT DOCUMENTS

| KR | 10-2004-0059490 | 2/2006 |
| KR | 10-2004-0111154 | 6/2006 |

* cited by examiner

Primary Examiner—Marcos D. Pizarro
Assistant Examiner—Igwe U. Anya
(74) Attorney, Agent, or Firm—Saliwanchik, Lloyd & Saliwanchik

(57) ABSTRACT

A semiconductor device and a method of fabricating a semiconductor device is provided. The semiconductor device can include a semiconductor substrate; an interlayer dielectric layer having a damascene pattern formed on the semiconductor substrate; a diffusion barrier formed in the damascene pattern and made of a trivalent material; a seed layer formed on the diffusion barrier; and a copper interconnection formed on the seed layer. In one embodiment, the trivalent material is CoFeB.

6 Claims, 4 Drawing Sheets

SEMICONDUCTOR DEVICE AND METHOD FOR FABRICATING THE SAME

CROSS-REFERENCE TO RELATED APPLICATION

The present application claims the benefit under 35 U.S.C. §119 of Korean Patent Application No. 10-2006-073474, filed Aug. 3, 2006, which is hereby incorporated by reference in its entirety.

BACKGROUND

In general, a metal interconnection is used to electrically interconnect devices in a semiconductor device. Aluminum (Al), aluminum alloy, and tungsten (W) are often used as the material for a metal interconnection.

However, since semiconductor devices are highly integrated, it is difficult to use such metals because of their low melting points and high specific resistances. Copper (Cu), gold (Au), silver (Ag), cobalt (Co), chromium (Cr), and nickel (Ni) all have excellent conductivity and can be used as the material for a metal interconnection. Particularly, copper and copper alloy, which have low specific resistivity, excellent reliability for electron migration (EM) and stress migration (SM), and low production cost, have been widely used.

Metal interconnections using copper are often formed using a damascene process. The damascene process forms a trench in an insulating layer through a photo process and an etching process and then fills a conductive material in the trench, such as W, Al, or Cu. Next, the majority of the conductive material is removed, leaving a required interconnection using an etch-back or chemical mechanical polishing (CMP) method, thereby forming an interconnection having the shape corresponding to the trench.

However, copper is not suitable for a dry etching process and does not easily adhere to $SiO_2$. Copper also has low thermo-dynamical stability and low resistance against corrosion. Furthermore, copper may serve as a deep level dopant that is diffused into silicon to produce acceptor and donor states in a band gap, thereby causing a leakage current or malfunction of a device.

Thus, there exists a need in the art for an effective diffusion barrier layer that can be used with copper.

BRIEF SUMMARY

Embodiments of the present invention provide a semiconductor device, wherein an amorphous layer is used as a diffusion barrier for preventing diffusion of copper, to enhance the performance of the semiconductor.

According to an embodiment, a semiconductor device is provided, including a semiconductor substrate, an interlayer dielectric layer having a damascene pattern formed on the semiconductor substrate, a diffusion barrier formed in the damascene pattern and made of a trivalent material, such as CoFeB, a seed layer formed on the diffusion barrier, and a copper interconnection formed on the seed layer.

Another embodiment of the present invention provides a method of fabricating a semiconductor device, which includes: forming an interlayer dielectric layer on a semiconductor substrate, and forming a damascene pattern in the interlayer dielectric layer; depositing a trivalent material, such as CoFeB, in a predetermined thickness on the interlayer dielectric layer, thereby forming a diffusion barrier; depositing a seed layer on the diffusion barrier; and filling a copper interconnection in the damascene pattern.

DETAILED DESCRIPTION

Embodiments of the present invention are described below with reference to the accompanying drawings.

Figure 1:
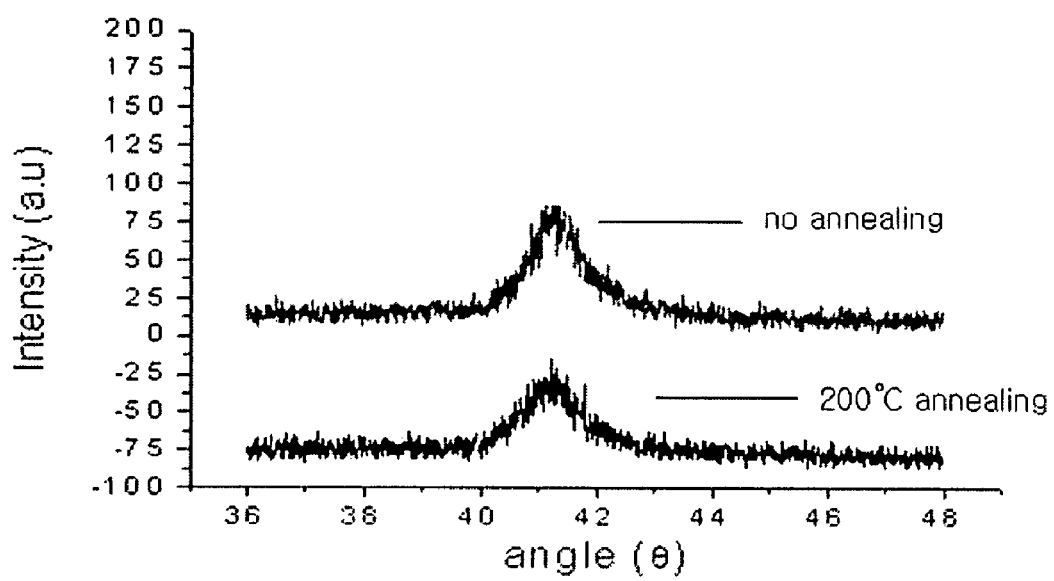
FIG. 1 is a graph showing intensity vs. angle for CoFeB.
Figure 2:
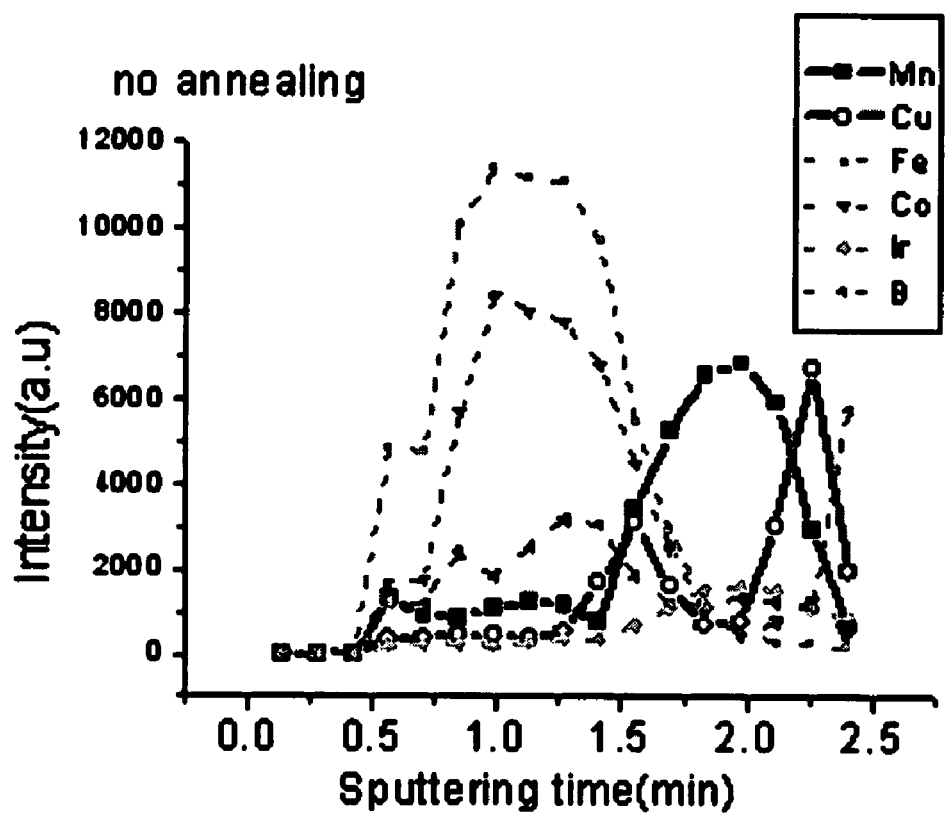
FIG. 2 shows a graph of intensity vs. sputtering time for CoFeB with no annealing.
Figure 3:
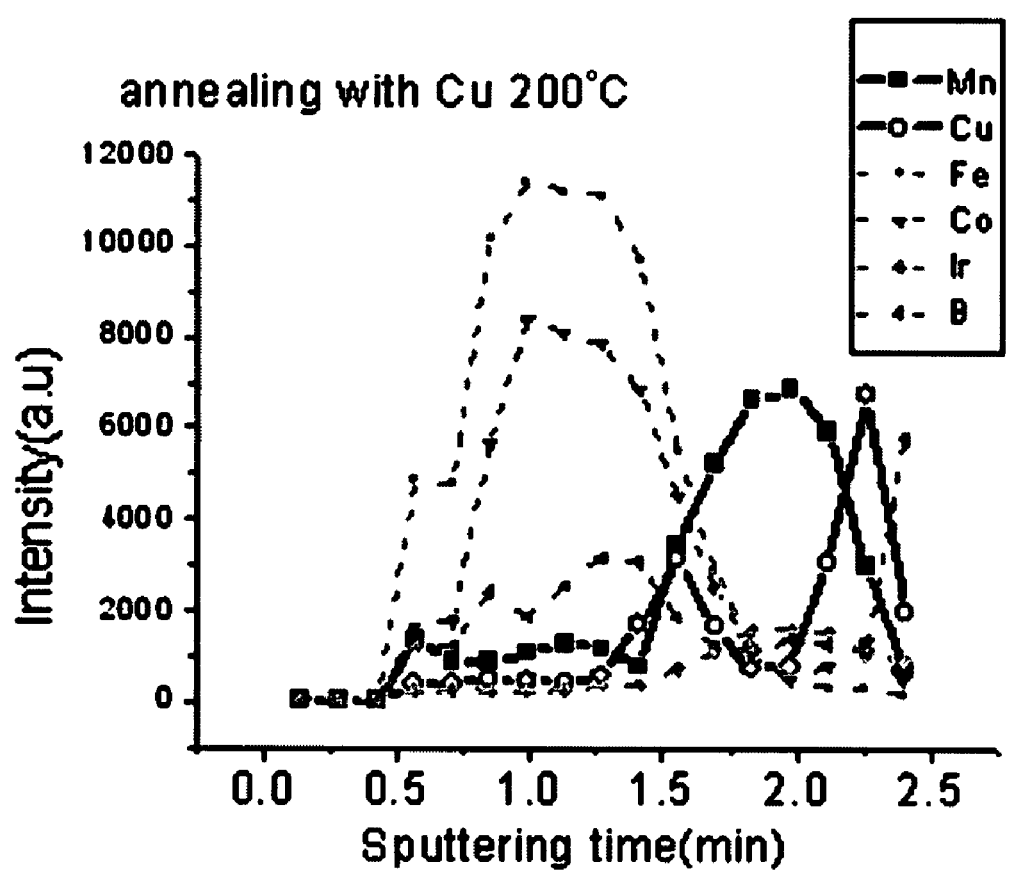
FIG. 3 shows a graph of intensity vs. sputtering time for CoFeB with annealing with copper at 200° C.

FIGS. 1 to 3 show graphs for intensity with respect to angle or sputtering time. These are for a device with a tantalum (Ta) layer, a first Cu layer, an IrMn layer, a second Cu layer, and a CoFeB layer The Ta layer, the first Cu layer, the IrMn layer, the second Cu layer, and the CoFeB layer are deposited at 50 Å, 20 Å, 100 Å, 6 Å and 100 Å, respectively. Sputtering is then performed from the CoFeB layer.

Referring to FIG. 1, the intensities of particles sputtered depend on a sputtering angle.

Each of the materials shows a peak in the graph of FIG. 1 at a predetermined angle due to a specific property thereof. Therefore, it can be determined that, if a peak is shown by a property of CoFe at a time when the CoFeB layer is sputtered, the CoFeB has a crystal structure. Additionally, if a peak is not shown by the property of CoFe at a specific angle, the CoFeB has an amorphous structure.

As shown in FIG. 1, the peak having an intensity between sputtering angles of about 44 and about 46 degrees is not from a property of CoFe itself. Thus, the CoFeB is a trivalent material with an amorphous structure.

Here, the peak of the intensity at about 41 degrees is shown by a property of IrMn.

In the structure in which Ta, Cu, IrMn, Cu and CoFeB are stacked, sputtering is performed in an order of CoFeB, Cu, IrMn, Cu and Ta. This structure helps determine whether or not the diffusion of Cu is prevented by identifying that Cu is observed in only a predetermined time zone as sputtering time increases.

After forming the stacked structure, it can be seen in FIG. 2 that a peak appears after a sputtering time of about 1.6 minutes. Another peak is also shown after a sputtering time of about 2.25 minutes.

Fe and Co are sputtered in an interval within 0.5 minute of initial sputtering, and Cu is extremely weakly sputtered. Thus, diffusion of Cu is inhibited by the CoFeB. Based on these tests, it can be seen that amorphous trivalent materials can provide improved diffusion barriers for copper. In an embodiment, CoFeB is used as a diffusion barrier of Cu. In an alternative embodiment, CoFeN, which is an amorphous trivalent material, is used as a diffusion barrier for Cu.

In an embodiment, the present invention provides a method of fabricating a semiconductor device using a trivalent material such as CoFeB as a diffusion barrier layer.

Figure 4:
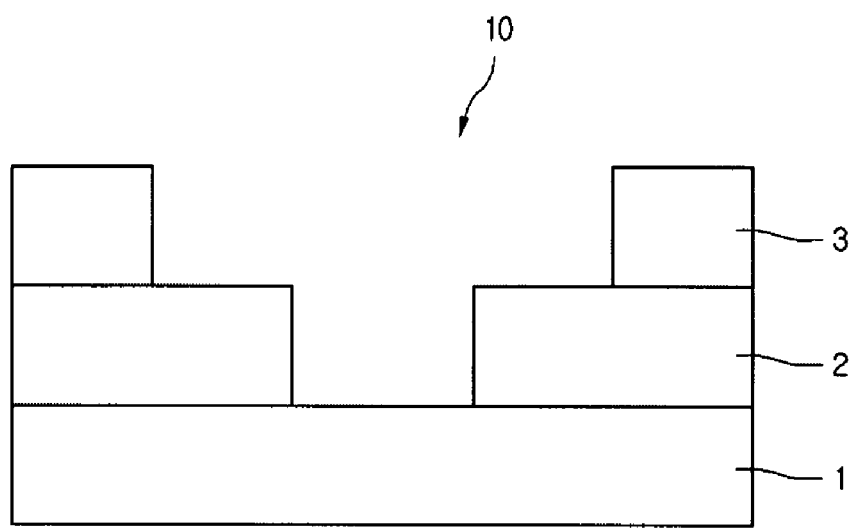
FIGS. 4 to 8 are cross-sectional views illustrating a method of fabricating a semiconductor device according to an embodiment of the present invention.

Referring to FIG. 4, in an embodiment, first and second interlayer dielectric layers 2 and 3 are stacked on a semiconductor substrate 1 having a layer formed with a device electrode or conductive layer. Next, photo and etching processes are performed with respect to the first and second interlayer dielectric layers 2 and 3, thereby forming a damascene pattern

10. In a further embodiment, a first etch stop layer, which is used as an etch stop point when etching the first interlayer dielectric layer 2, can be formed between the first interlayer dielectric layer 2 and the semiconductor substrate 1. The first etch stop layer can be formed directly on the semiconductor substrate 1. A second etch stop layer can be formed between the first and second interlayer dielectric layers 2 and 3, on the first interlayer dielectric layer 2. In certain embodiments, the second etch stop layer can be formed as a nitride layer (SiN) using plasma enhanced CVD (PECVD) equipment.

Figure 5:
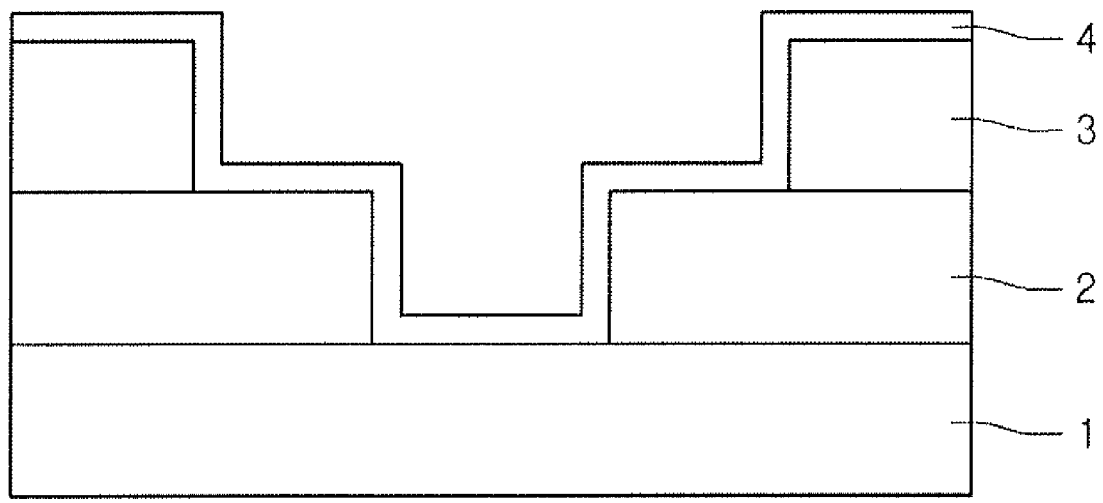

Referring to FIG. 5, in an embodiment, a diffusion barrier 4 is formed at a portion exposed as the damascene pattern 10 is formed. The diffusion barrier 4 helps prevent Cu from a copper interconnection in the damascene pattern 10 from being diffused into the interlayer dielectric layers 2 and 3.

The diffusion barrier 4 can be formed by depositing a trivalent material through a physical vapor deposition (PVD) method. In an embodiment the trivalent material is CoFeB. In another embodiment, the trivalent material is CoFeN. In many embodiments using CoFeB as the diffusion barrier 4, the composition ratio of the CoFeB is set as cobalt (Co) (in the range of about 30% to about 70%): iron (Fe) (in the range of about 70% to about 30%): boron (B) (in the range of about 5 to about 10%). The diffusion barrier 4 can have a thickness of 500 Å to 1000 Å.

The composition ratio of Co and Fe is high relative to that of B in the CoFeB for the purpose of enhancing electric conductivity for connection between layers in the semiconductor device.

Figure 6:
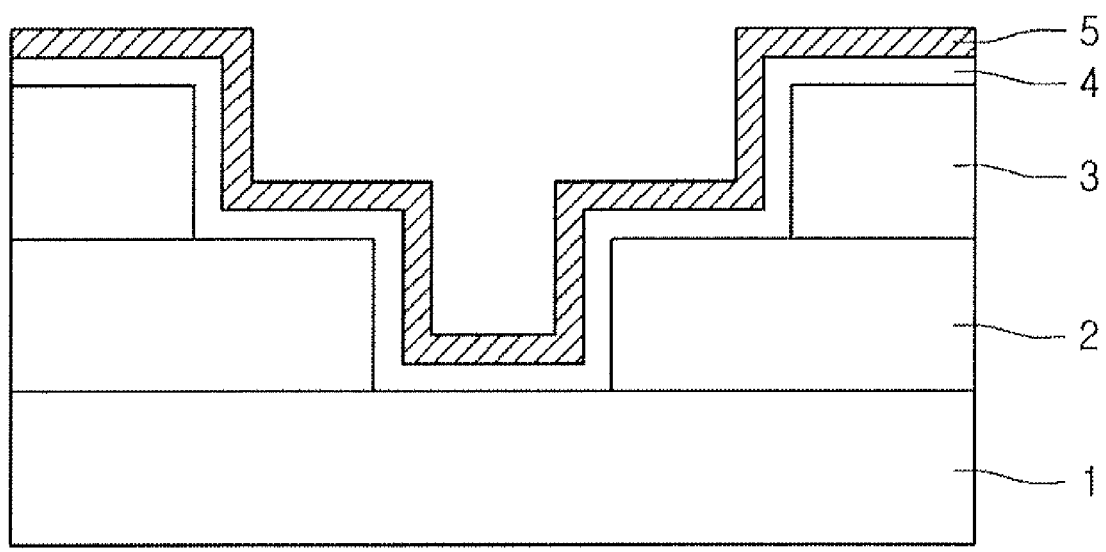

Referring to FIG. 6, a seed layer 5 can be formed on the diffusion barrier 4. The seed layer 5 functions to smoothly supply electrons to a copper interconnection to be filled in the damascene pattern 10, thereby accelerating the growth of the copper interconnection. In one embodiment, Cu can be deposited on the seed layer 5 through chemical vapor deposition (CVD).

Figure 7:
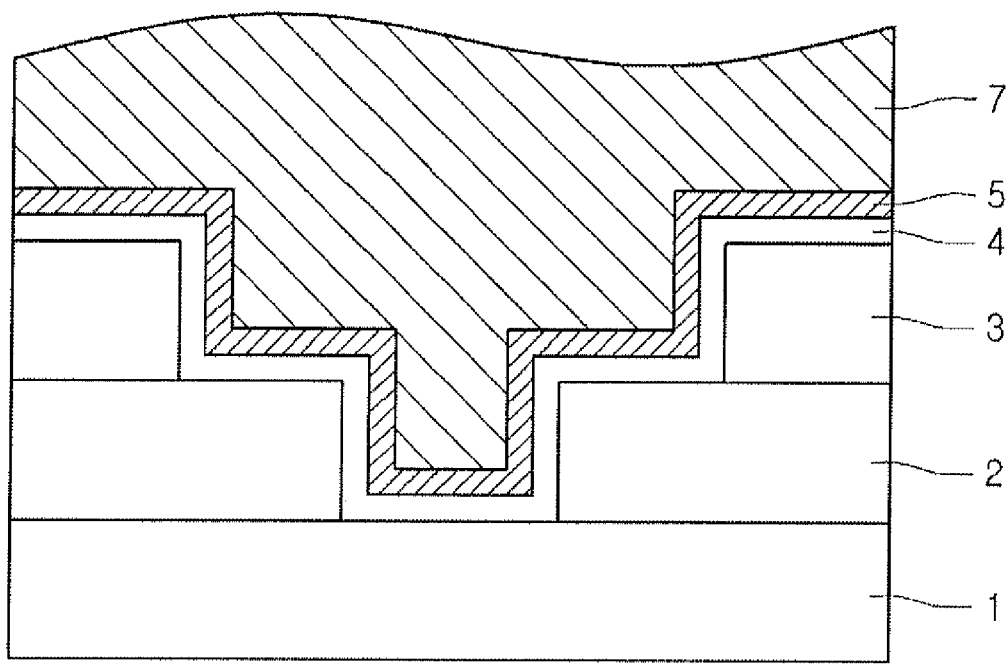

Referring to FIG. 7, in an embodiment, Cu for interconnection between layers is formed on the seed layer 5 through an electro copper plating or CVD method, thereby forming a copper interconnection 7. When filling the copper interconnection, the seed layer 5 can be diffused into the copper interconnection 7 while accelerating the growth of Cu.

Figure 8:
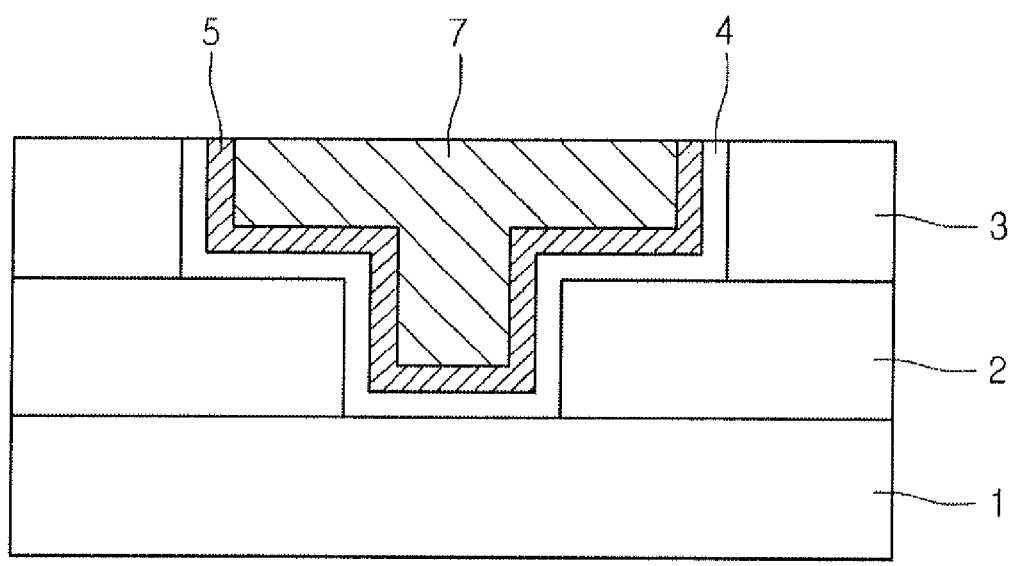

Referring to FIG. 8, in an embodiment, after forming the copper interconnection 7, a CMP process is performed, thereby implementing planarization of a surface of the copper interconnection 7.

In many embodiments, the material used for the diffusion barrier 4 is a trivalent amorphous material. Trivalent amorphous materials provide an improved barrier against copper diffusion in semiconductor devices. In an embodiment, the diffusion barrier 4 is CoFeB. In another embodiment, the diffusion barrier is CoFeN.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification do not necessarily all refer to the same embodiment. Furthermore, when a particular feature, structure, or characteristic is described in connection with any embodiment, it is to be understood that it is within the purview of one skilled in the art to effect such feature, structure, or characteristic in connection with other embodiments.

Although the invention has been described with reference to certain embodiments, it should be understood that numerous other modifications and embodiments can be devised by those skilled in the art that will fall within the spirit and scope of the principles of this disclosure and the appended claims. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a semiconductor substrate;
    an interlayer dielectric layer having a damascene pattern on the semiconductor substrate;
    a diffusion barrier comprising a trivalent material formed in the damascene pattern;
    a seed layer formed on the diffusion barrier; and
    a copper interconnection formed on the seed layer;
    wherein the diffusion barrier comprises CoFeN.

2. The semiconductor device according to claim 1, wherein the diffusion barrier comprises an amorphous trivalent material.

3. The semiconductor device according to claim 1, wherein the diffusion barrier has a thickness of about 500 Å to about 1000 Å.

4. A method of fabricating a semiconductor device, comprising:
    forming an interlayer dielectric layer on a semiconductor substrate;
    forming a damascene pattern in the interlayer dielectric layer;
    depositing a trivalent material on the interlayer dielectric layer to form a diffusion barrier;
    depositing a seed layer on the diffusion barrier; and
    filling a copper interconnection in the damascene pattern;
    wherein the diffusion barrier comprises CoFeN.

5. The method according to claim 4, wherein the diffusion barrier comprises an amorphous trivalent material.

6. The method according to claim 4, wherein the diffusion barrier has a thickness of about 500 Å to about 1000 Å

* * * * *